(12) United States Patent
Qian

(10) Patent No.: US 6,649,218 B2
(45) Date of Patent: Nov. 18, 2003

(54) SINGLE SUBSTRATE PROCESSING FILM FORMING METHOD

(75) Inventor: Shao Shou Qian, Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/859,388

(22) Filed: May 18, 2001

(65) Prior Publication Data

US 2001/0054388 A1 Dec. 27, 2001

(30) Foreign Application Priority Data

May 22, 2000 (JP) ........................................ 2000-149642
Feb. 1, 2001 (JP) ........................................ 2001-026170

(51) Int. Cl.⁷ .............................. C23C 16/40; B05D 3/02
(52) U.S. Cl. ................ 427/255.31; 427/535; 427/376.2
(58) Field of Search ....................... 427/255.31, 255.32, 427/255.37, 533, 535, 376.2

(56) References Cited

U.S. PATENT DOCUMENTS 6,204,203 B1 * 3/2001 Narwankar et al. ......... 438/785
6,224,934 B1 * 5/2001 Hasei et al. .................. 427/10

FOREIGN PATENT DOCUMENTS

| JP | 10-182300 | 7/1998 |
| JP | 10-229080 | 8/1998 |
| JP | 2000-68265 | 3/2000 |

* cited by examiner

Primary Examiner—Bret Chen
(74) Attorney, Agent, or Firm—Oblon, Spivak, McClelland, Maier & Neustadt, P.C.

(57) ABSTRACT

A single substrate processing film forming method including depositing an amorphous metal oxide film on a target substrate by chemical vapor deposition and reforming the metal oxide film in a reforming gas to remove an organic impurity contained in the film. The reforming gas is mixture of an excited oxygen gas with a non-excited oxygen gas. The reformation heats the film to a temperature higher than a crystallization temperature of the amorphous metal oxide film to perform crystallization at the same time.

22 Claims, 11 Drawing Sheets

APPARATUS 6: DEPOSITION

APPARATUS 8: REFORMATION (TEMPERATURE: FROM ROOM TEMPERATURE TO 700°C)

APPARATUS 8: CRYSTALLIZATION (TEMPERATURE: NOT LOWER THAN 700°C)

APPARATUS 6:DEPOSITION

APPARATUS 8:REFORMATION+CRYSTALLIZATION
(TEMPERATURE:NOT LOWER THAN 700°C)

APPARATUS 10:DEPOSITION

APPARATUS 10:REFORMATION(TEMPERATURE:FROM ROOM
TEMPERATURE TO 700°C)

APPARATUS 12:CRYSTALLIZATION
(NOT LOWER THAN 700°C)

APPARATUS 10:DEPOSITION

APPARATUS 10:REFORMATION(TEMPERATURE:FROM ROOM
TEMPERATURE TO 700°C)

APPARATUS 10:DEPOSITION

APPARATUS 10:REFORMATION(TEMPERATURE:FROM ROOM
TEMPERATURE TO 700°C)

APPARATUS 12:CRYSTALLIZATION(TEMPERATURE:NOT
LOWER THAN 700°C)

APPARATUS 10: (DEPOSITION+REFORMATION)

APPARATUS 12: CRYSTALLIZATION

SINGLE SUBSTRATE PROCESSING FILM FORMING METHOD

CROSS-REFERENCE TO RELATED APPLICATIONS

This application is based upon and claims the benefit of priority from the prior Japanese Patent Applications No. 2000-149642, filed May 22, 2000; and No. 2001-026170, filed Feb. 1, 2001, the entire contents of both of which are incorporated herein by reference.

BACKGROUND OF THE INVENTION

The present invention relates to a single-substrate-processing-film-forming method and a single-substrate-heat-processing apparatus for treating a metal oxide film, such as a tantalum oxide film, in a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

In order to manufacture semiconductor devices, film formation and pattern etching are repeatedly applied to a semiconductor wafer. As semiconductor devices are becoming more and more highly miniaturized and integrated, demands on film formation have become stricter. For example, very thin insulating films, such as capacitor insulating films and gate insulating films are required to be even thinner and to be more insulating.

Conventionally, silicon oxide films and silicon nitride films are used as the insulating films. In recent years, however, it has been proposed to form the insulating films from materials having even higher dielectric constant and higher insulating properties, such as a metal oxide, e.g., tantalum oxide ($Ta_2O_5$). The metal oxide film has an insulation property of high reliability even where it has a small effective film thickness, and can further have a high insulation property by means of a reformation process performed after the film deposition (Jpn. Pat. Appln. KOKAI Publication No. 2-283022).

A metal oxide film of this kind can be deposited by means of MOCVD (Metal Organic Chemical Vapor Deposition), i.e., using a vaporized metal organic compound. To form a tantalum oxide film by means of MOCVD, a metal (tantalum) alkoxide, such as $Ta(OC_2H_5)_5$ (pentoethoxytantalum: PET) is used as a raw material liquid. The raw material liquid is made to bubble by e.g., nitrogen gas, or vaporized by a vaporizer set at a vaporizing temperature, to be in a gaseous state, and is supplied to a process chamber preset to have a vacuum atmosphere. At the same time, an oxidizing gas, such as oxygen, is supplied to the process chamber. The supplied raw material is decomposed to offer a film forming material on the surface of a semiconductor wafer heated to a process temperature of from about 400 to 500° C. With this film forming material, a tantalum oxide ($Ta_2O_5$) film is formed on the surface of the semiconductor wafer by means of deposition.

In order to reform the tantalum oxide film, i.e., to improve the insulating property, the wafer is transferred into an atmosphere containing ozone. The ozone is irradiated with UV (ultraviolet) rays emitted from a mercury lamp, so that activated oxygen is generated. The activated oxygen causes organic impurities, such as C—C bonds, contained in the metal oxide film to be decomposed and dissociated therefrom, thereby reforming the tantalum oxide film. As a reformation process of this kind other than the UV ozone reformation process, there is known a so-called remote plasma reformation process utilizing a plasma generating mechanism, which includes an RF (Radio Frequency) power supply disposed on the ceiling of a process chamber. In the case of the remote plasma reformation process, radicals generated by the plasma generating mechanism flow down into the vacuum process field, thereby reforming the tantalum oxide film. If necessary, the reformed tantalum oxide film is then subjected to a crystallization process, in which the film is exposed to a high temperature to degas it.

FIGS. 14A to 14C are views showing a conventional method of forming a tantalum oxide film as an insulating metal oxide film. First, in a CVD apparatus, a tantalum oxide ($Ta_2O_5$) film having a certain thickness is deposited on a semiconductor wafer W (FIG. 14A). In this process, a vaporized metal alkoxide and $O_2$ gas are supplied into a process chamber having a vacuum atmosphere in which the semiconductor wafer W is placed. The process temperature at this time is set at, e.g., about 460° C.

Then, the wafer W is transferred to a reforming apparatus and the tantalum oxide film 2 is reformed in this apparatus (FIG. 14B). In the case of a UV ozone process, the wafer W is placed in an atmosphere containing ozone ($O_3$), and UV rays emitted from a UV lamp are radiated onto the ozone above the surface of the wafer W. With the reformation process, the energy of the UV rays and activated oxygen cause organic impurities, such as C—C bonds and hydrocarbons, contained in the tantalum oxide film 2 to be decomposed and dissociated therefrom, thereby reforming the tantalum oxide film 2. The process temperature of the reformation is set at a temperature of, e.g., about 425° C., which is not higher than the crystallization temperature of tantalum oxide, to maintain the non-crystal or amorphous state of the film 2. The reformation may be performed by a remote plasma reformation process using radicals, as described above.

Then, the wafer W is transferred to a heat-processing apparatus and the tantalum oxide film 2 is crystallized in this apparatus (FIG. 14C). In this process, an atmosphere containing oxygen gas, and a process temperature, e.g., not lower than 700° C., which is higher than the crystallization temperature of tantalum oxide, are used. With this crystallization annealing process, the tantalum oxide film 2 is compacted in a molecular level, and is planarly uniformed in the film thickness, thereby providing an insulating film having a good insulating property.

In the method shown in FIGS. 14A to 14C, where the UV ozone process is used for the reformation, the insulating property of the tantalum oxide film 2 is occasionally not sufficiently reformed. Where the remote plasma process is used for the reformation, not only generated radicals but also ions and electrons both having high energy, which damage the surface of the wafer, flow into the process field.

Furthermore, in the method shown in FIGS. 14A to 14C, the processing time increases with the square of the increasing rate of the thickness of the tantalum oxide film, in order to reform the entirety of the tantalum oxide film. In other words, the processing time acceleratively increases with an increase in the film thickness. In addition, the method requires three process steps, i.e., deposition, reformation, and crystallization, thereby increasing the number of steps. At the same time, the method requires processing apparatuses corresponding to the process steps, thereby increasing the system cost.

BRIEF SUMMARY OF THE INVENTION

An object of the present invention is to provide a single-substrate-processing-film-forming method and a single-substrate-heat-processing apparatus, which allow a metal oxide film having excellent properties to be formed.

Another object of the present invention is to provide a single-substrate-processing-film-forming method and a single-substrate-heat-processing apparatus, which provide advantages in the process throughput and system cost.

According to a first aspect of the present invention, there is provided a single-substrate-processing-film-forming method comprising the steps of:

performing a deposition process of depositing a film consisting essentially of an amorphous metal oxide on a target substrate by means of CVD; and performing a reformation process of removing an organic impurity contained in the film, wherein the reformation process comprises a step of supplying an excited oxygen gas as a reforming gas into a process chamber accommodating the target substrate, while exhausting the process chamber, the reforming gas being set to have a concentration of ions and electrons not more than $10^5/cm^3$.

According to a second aspect of the present invention, there is provided a single-substrate-processing-film-forming method comprising the steps of:

performing a deposition process of depositing a film consisting essentially of an amorphous metal oxide on a target substrate by means of CVD; and performing a reformation process of removing an organic impurity contained in the film, wherein the deposition process comprises a step of supplying a raw material gas, which offers a metal of the metal oxide by decomposition, and an oxidizing gas into a process chamber accommodating the target substrate, while exhausting the process chamber, the reformation process comprises a step of supplying an excited oxygen gas as a reforming gas into a process chamber accommodating the target substrate, while exhausting the process chamber, the reforming gas being set to have a concentration of ions and electrons not more than $10^5/cm^3$, and the method comprises a step of performing the deposition process and the reformation process at substantially the same time, by supplying the raw material gas, the oxidizing gas, and the reforming gas into the process chamber at substantially the same time.

According to a third aspect of the present invention, there is provided a single-substrate-processing-film-forming apparatus comprising:

an airtight process chamber configured to accommodate a target substrate having a film consisting essentially of an amorphous metal oxide thereon;

a worktable configured to support a target substrate within the process chamber;

a heater configured to heat the film while the target substrate is placed on the worktable;

an exhaust section configured to exhaust the process chamber; and a reforming gas supply section configured to supply excited oxygen gas into the process chamber, the excited oxygen gas being used as a reforming gas for performing a reformation process of removing an organic impurity contained in the film, the reforming gas being set to have a concentration of ions and electrons not more than $10^5/cm^3$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
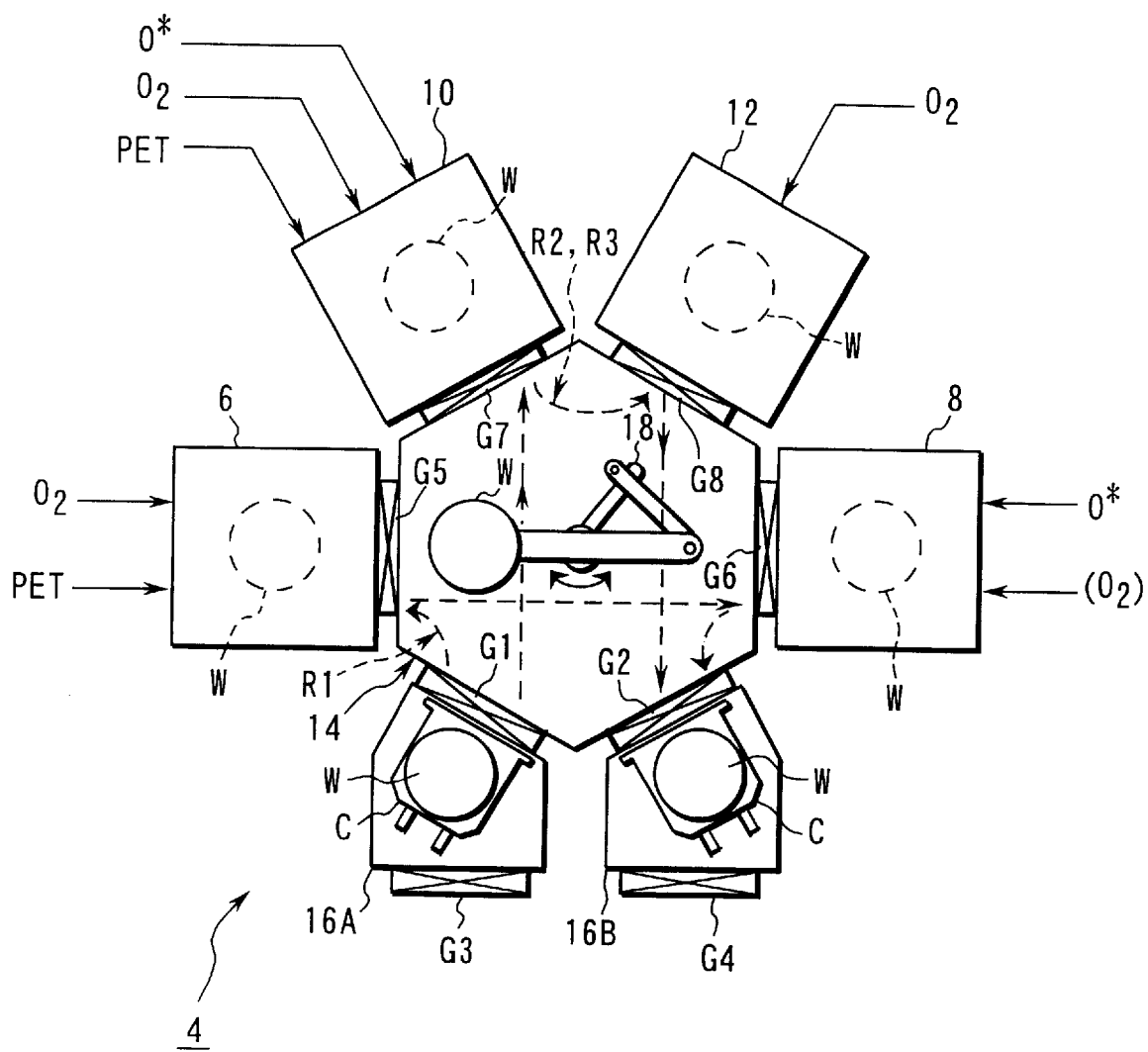
FIG. 1 is a schematic plan view showing a film-forming system according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a schematic plan view showing a film-forming system according to an embodiment of the present invention. The film-forming system 4 includes a CVD apparatus 6, a heat-processing apparatus 8, a heat-processing apparatus 10, and a heat-processing apparatus 12. The apparatuses 6, 8, 10, and 12 are connected to each other through a common transfer apparatus 14. The common transfer apparatus 14 is also connected to cassette chambers 16A and 16B, which respectively receive cassettes C for accommodating a plurality of semiconductor wafers, and constitute wafer transfer ports for the entire system. In other words, the film-forming system 4 has a so-called cluster tool structure, in which semiconductor wafers W or target substrates to be processed are transferred among the apparatuses 6, 8, 10, and 12 and the cassettes 16A and 16B through a transfer passage maintaining a vacuum atmosphere, which is formed by the common transfer apparatus 14. If necessary, a pre-heating chamber for pre-heating an unprocessed wafer and a cooling chamber for cooling a processed wafer may be connected to the common transfer apparatus 14.

The CVD apparatus 6 is used to perform a deposition process such that an amorphous metal oxide film is deposited on a wafer W, using a vaporized precursor or material of the metal oxide film and an oxidizing gas in a vacuum atmosphere. The heat-processing apparatus 8 is used to perform a reformation process and a crystallization process simultaneously or selectively. The reformation process in the apparatus 8 is performed such that the metal oxide film is exposed to a reforming gas, such as an excited oxygen gas containing substantially no ions or electrons, in a vacuum atmosphere. The crystallization process in the apparatus 8 is performed such that the wafer is heated to a temperature not lower than the crystallization temperature of the metal oxide film in a vacuum atmosphere containing the reforming gas described above. The heat-processing apparatus 10 is used to perform a deposition process or a reformation process, selectively using a vaporized precursor or material of a metal oxide film, an oxidizing gas, and a reforming gas, or to perform the deposition process and the reformation process at a time, using the gases together. The heat-processing apparatus 12 is an apparatus dedicated only to a crystallization process of a metal oxide film.

The cassette chambers 16A and 16B are connected to the common transfer chamber 14 by gate valves G1 and G2, respectively. Each of the cassette chambers 16A and 16B has a cassette stage (not shown), which is movable up and down, and rotatable. The cassette chambers 16A and 16B are provided with gate doors G3 and G4, respectively, which are opened/closed relative to the atmosphere, i.e., an outer working room atmosphere. Cassettes C are transferred between the system 4 and the outside through the opened gate doors G3 and G4. The apparatuses 6, 8, 10, and 12 are connected to the common transfer chamber 14 by gate valves G5, G6, G7, and G8, respectively. The common transfer chamber 14 is provided therein with a transfer mechanism 18 consisting of a multi-joint arm, which is extendable and rotatable. The transfer mechanism 18 transfers wafers among the cassette chambers 16A and 16B, and the apparatuses 6, 8, 10, and 12.

Each of the apparatuses 6, 8, 10, 12, and 14 and the cassette chambers 16A and 16B have an airtight structure. Each of the apparatuses 6, 8, 10, 12, and 14 and the cassette chambers 16A and 16B are connected to, e.g., an $N_2$ gas supply section (not shown) for purging the interior of the apparatus with $N_2$ gas, and a vacuum exhaust section (not shown) for vacuum-exhausting the interior of the apparatus. The gas supply section and the vacuum exhaust section of each of the apparatuses 6, 8, 10, 12, and 14 and the cassette chambers 16A and 16B can be controlled independently of those of the other apparatuses.

In the CVD apparatus 6, an amorphous metal oxide film, such as a tantalum oxide ($Ta_2O_5$) film, is deposited on the surface of a wafer by means of CVD. A metal (tantalum) alkoxide, i.e., an organic compound, such as $Ta(OC_2H_5)_5$ (pentoethoxytantalum: PET), is used as a raw material liquid of the metal oxide film. The raw material liquid is made to bubble, and is supplied. The CVD is performed in an atmosphere containing a mixture of this raw material gas and an oxidizing gas, such as $O_2$. As the oxidizing gas, $O_3$, $N_2O$, $NO$, $NO_2$, or a vaporized alcohol may be used, in place of $O_2$.

The heat-processing apparatus 12 dedicated only to crystallization includes a process chamber capable of being vacuum-exhausted, in which a worktable with a built-in heater is disposed. A wafer with the metal oxide film formed thereon is placed on the worktable, and is heated to a temperature not lower than the crystallization temperature of the metal oxide film in an atmosphere containing, e.g., $O_2$, so that the metal oxide film is crystallized.

A detailed explanation will be given of the heat-processing apparatus 10 for performing deposition and reformation, and the heat-processing apparatus 8 for performing reformation and crystallization. In the following explanation, a tantalum oxide ($Ta_2O_5$) film is formed as a metal oxide film by means of CVD.

Figure 2:
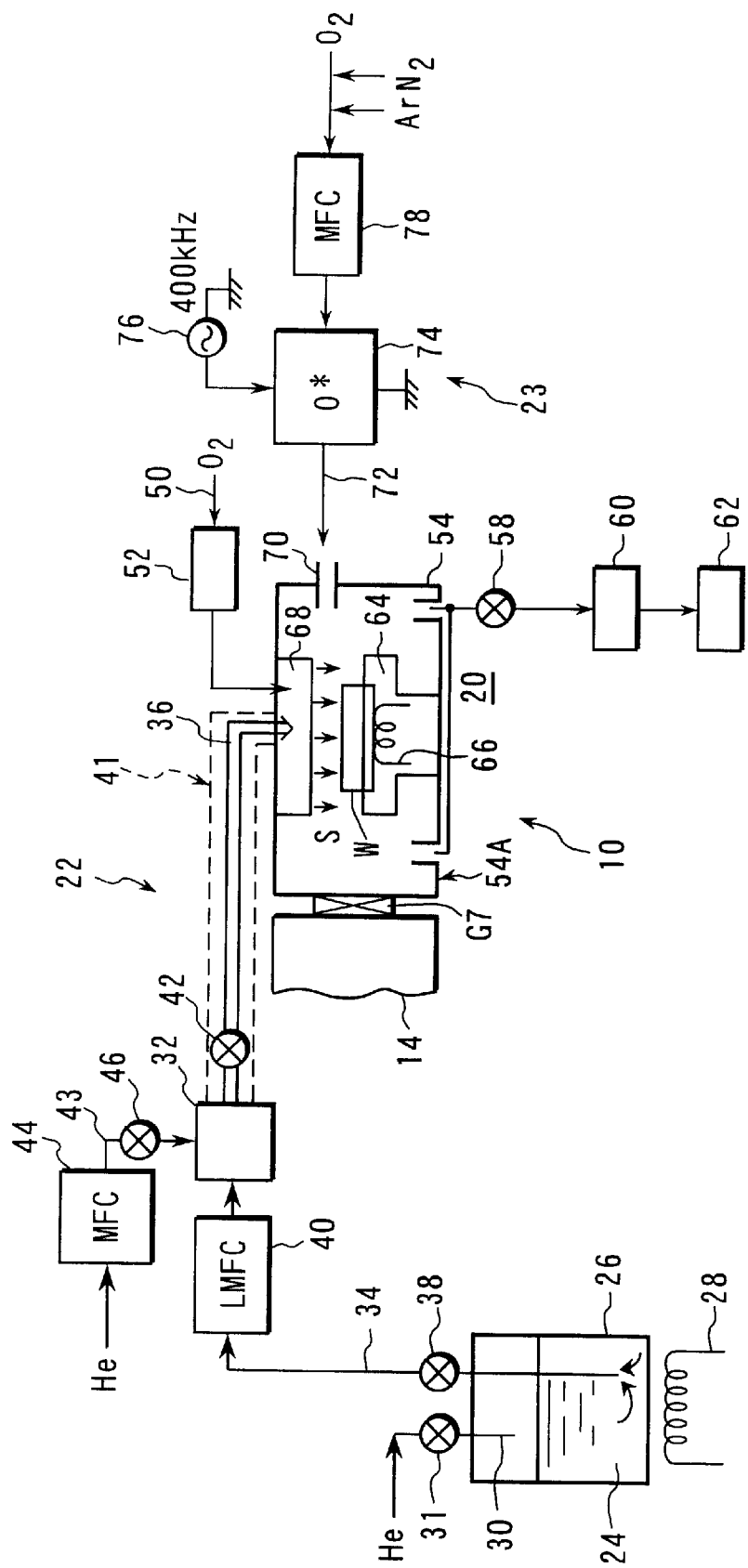
FIG. 2 is a constitutional view showing a heat-processing apparatus for performing deposition and reformation employed in the film-forming system shown in FIG. 1.

FIG. 2 is a constitutional view showing the heat-processing apparatus 10 for performing deposition and reformation. As shown in FIG. 2, the heat-processing apparatus 10 includes an apparatus main body 20. The main body 20 is connected to a raw material gas supply section 22 for supplying an oxidizing gas and a vaporized precursor of a metal oxide film, i.e., a raw material gas. The main body 20 is also connected to a reforming gas supply section 23 for supplying a reforming gas consisting of an excited oxygen gas containing substantially no ions or electrons.

The raw material gas supply section 22 includes an airtight raw material tank 26 for storing a liquid raw material 24 of the metal oxide film, such as a metal alkoxide, e.g., $Ta(OC_2H_5)_5$. The tank 26 is provided with a heater 28 for heating the raw material 24 to a temperature of, e.g., from about 20 to 50° C., at which the raw material 24 of liquid easily flows. A certain amount of a reaction accelerator, such as alcohol, is added to the raw material 24.

A pressuring tube 30 with a switching valve 31 is inserted into the vapor space of the raw material tank 26. A pressuring gas, such as He gas, is supplied through the pressuring tube 30 into the vapor space of the tank 26. The tank 26 is connected to the inlet of a vaporizer 32, i.e., vaporizing means, by a raw material liquid line 34 formed of, e.g., a stainless steel tube. The outlet of the vaporizer 32 is connected to the ceiling of the apparatus main body 20 by a raw material gas line 36 formed of, e.g., a stainless steel tube. The upstream end of the liquid line 34 is inserted into the raw material 24 of liquid down to a position near the bottom. The raw material 24 is transferred into the liquid line 34 by the pressure of the pressurizing gas. The liquid line 34 is provided with a switching valve 38 and a liquid mass flow controller 40, so that the raw material liquid 24 is supplied into the vaporizer 32 at a controlled supply rate.

The raw material gas line 36 is provided with a switching valve 42 at a position immediately downstream the vaporizer 32, for stopping the supply of the raw material gas. The gas line 36 downstream the vaporizer 32 and the switching valve 42 are wrapped with a temperature-maintaining heater 41, such as a tape heater. With the heater 41, the gas line 36 is kept at a temperature of, e.g., from 150 to 180° C., which is higher than the condensation temperature of the raw material gas, and lower than the decomposition temperature of the raw material gas.

The vaporizer 32 is connected to a vaporizing gas line 43, so that a vaporizing gas, such as He gas, is supplied into the vaporizer 32 at a flow rate controlled by a flow controller 44. The gas line 43 is provided with a switching valve 46. An oxidizing gas line 50, which is part of the raw material gas supply section 22, is connected to the ceiling of the apparatus main body 20. The gas line 50 is provided with a flow controller 52, such as a mass flow controller, so that $O_2$ gas, i.e., the oxidizing gas, is supplied at a controlled flow rate.

The apparatus main body 20 includes a process chamber 54 formed of a cylinder of, e.g., aluminum. An exhaust port 56 is formed around the center of the bottom 54A of the process chamber 54. The exhaust port 56 is connected to a vacuum exhaust section 62 including a vacuum pump 60 through a line with a switching valve 58, so that the interior of the process chamber 54 can be vacuum-exhausted.

A worktable 64 formed of a circular plate of a non-conductive material, such as aluminum oxide, is disposed in the process chamber 54. A target substrate, such as a semiconductor wafer W, is mounted and supported on the worktable 64. A resistance heater 66 of carbon coated with SiC is embedded in the worktable 64 as heating means. The wafer mounted on the worktable 64 is heated to a predetermined temperature by the resistance heater 66. In place of the resistance heater 66, a heating lamp, such as a halogen lamp, may be used as means of heating the wafer.

The top portion of the worktable 64 is constituted as an electrostatic chuck (not shown), made of, e.g., a ceramic. The wafer is attracted and held on the top of the worktable 64 by a Coulomb's force generated by the electrostatic chuck. In place of the electrostatic chuck, a mechanical clamp may be used.

A showerhead 68 is airtightly disposed on the ceiling of the process chamber 54. The showerhead 68 faces and covers substantially the entirety of the top of the worktable 64. The showerhead 68 has inlets connected to the raw material gas line 36 and the oxidizing gas line 50, respectively. The raw material gas and the oxidizing gas are supplied into the process chamber 54 like a shower, selectively or together. The inside of the showerhead 68 is arranged to cause the raw material gas and oxidizing gas ($O_2$ gas) to flow separately from each other. The process chamber 54 is connected to the common transfer apparatus 14, which can be vacuum-exhausted, by a gate valve G7.

As part of the reforming gas supply section 23, a reforming gas nozzle 70 is disposed on the sidewall of the process chamber 54. The nozzle 70 is connected to a reforming gas generator 74 through a reforming gas line 72. The reforming gas generator 74 is provided with an RF (Radio Frequency) power supply 76 of, e.g., 400 KHz. An oxygen gas ($O_2$ gas) is supplied into the generator 74 at a flow rate controlled by a flow controller 78, such as a mass flow controller. As the reforming gas generator 74 and the RF power supply 76, ASTRON (TM) produced by ASTex Co., which includes them as an integrated unit, may be used.

In the generator 74, plasma is generated by an RF power from the RF power supply 76, so that the $O_2$ gas is excited and oxygen radials (O*) are generated. If necessary, a carrier gas, such as Ar gas, may be used, and/or a catalytic gas, such as $N_2$ gas, for accelerating the activation of the oxygen gas may be mixed at a rate of from 0 to 15 flow-rate %, and preferably of from 0 to 5 flow-rate %. In the generator 74, ions and electrons having high energy are generated in addition to oxygen radicals. However, while the reforming gas is transferred from the reforming gas generator 74 to the process chamber 54 through the reforming gas line 72, the ions and electrons disappear in the reforming gas generator 74 and the reforming gas line 72. As a result, the reforming gas consisting of an excited oxygen gas containing substantially no ions or electrons is finally supplied into the process chamber 54 from the reforming gas nozzle 70.

More specifically, the length of the reforming gas line 72 from the reforming gas generator 74 to the reforming gas nozzle 70 is set to cause the ions and electrons to surely disappear. The reforming gas is set to have a concentration of ions and electrons not more than $10^5/cm^3$. The gas line 72 may be provided with a trap mechanism for trapping the ions and electrons, so that the line 72 can be shorter. The worktable 64 may be rotatable, so that the reforming gas is uniformly supplied onto the wafer surface, thereby improving the planar uniformity in the reformation process.

Figure 3:
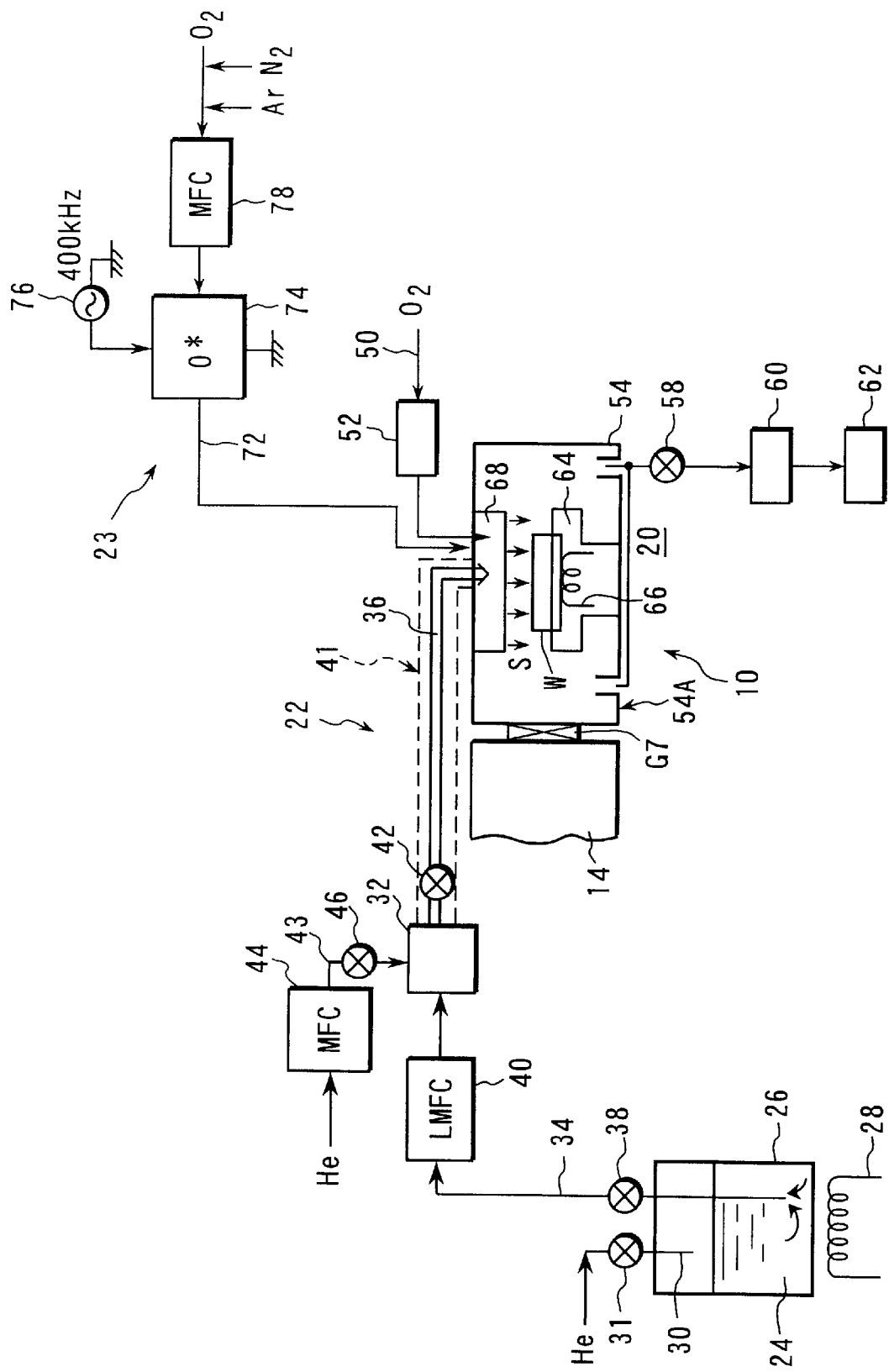
FIG. 3 is a constitutional view showing a modification of the heat-processing apparatus shown in FIG. 2.

FIG. 3 is a constitutional view showing a modification of the heat-processing apparatus 10 shown in FIG. 2. In this modification, a reforming gas line 72 is connected not to a reforming gas nozzle 70, but to a showerhead 68, so that a reforming gas is supplied through the showerhead 68. Since the reforming gas is supplied through the showerhead 68, the gas line 72 is preferably shorter. Also in this case, the inside of the showerhead 68 is arranged to cause the reforming gas and the other gas to flow separately from each other. In other words, the reforming gas and the other gas are supplied to be mixed in a process field S for the first time, i.e., a so-called post-mix state. Since the reforming gas is supplied from the showerhead 68, it is possible to improve the planar uniformity in the reformation process, without rotating a worktable 64.

Figure 13:
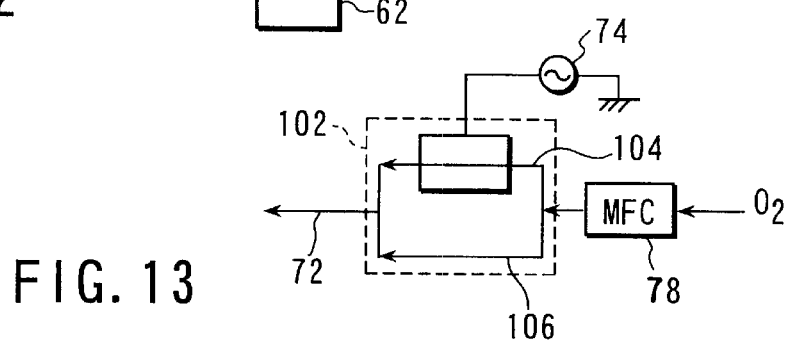
FIG. 13 is a view showing a modification of a reforming gas generator.
Figure 14A:
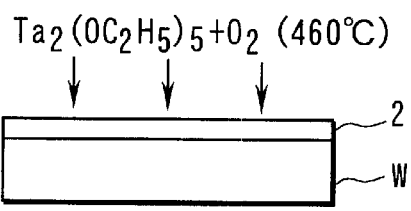
FIGS. 14A, 14B, and 14C are views showing a conventional method of forming a tantalum oxide film as an insulating metal oxide film.
Figure 14B:
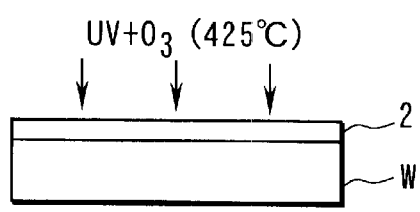
Figure 14C:
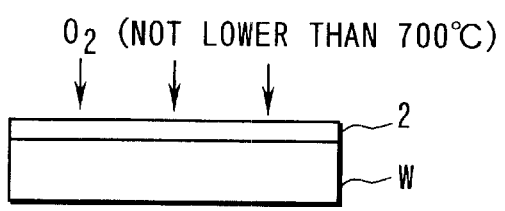

FIG. 13 is a view showing a modification of a reforming gas generator. The reforming gas generator 102 according this modification has a structure in which oxygen gas from a flow controller 78 is divided into first and second passages 104 and 106. The oxygen gas in the first passage 104 is excited to generate plasma by an RF power from an RF power supply 76. The excited oxygen gas, which has flowed through the first passage 104, is mixed with the non-excited oxygen gas, which has flowed through the second passage, so that ions and electrons in the plasma disappear. As a result, the reforming gas generated in the generator 102 has a sufficiently low concentration of ions and electrons, so that a reforming gas line 72 can be shorter.

Figure 4:
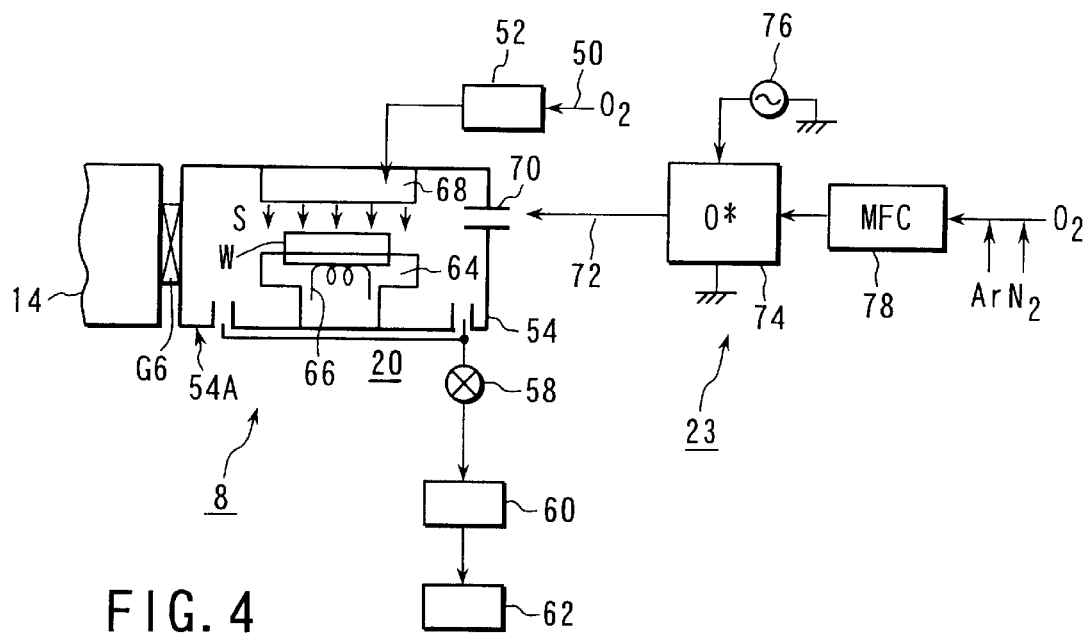
FIG. 4 is a constitutional view showing a heat-processing apparatus for performing reformation and crystallization employed in the film-forming system shown in FIG. 1.

FIG. 4 is a constitutional view showing the heat-processing apparatus 8 for performing reformation and crystallization. As shown in FIG. 4, the heat-processing apparatus 8 has a structure similar to that of the heat-processing apparatus 10 for performing deposition and reformation shown in FIG. 2, but excludes the raw material gas supply section 22 except the oxidizing gas supply system. In other words, the heat-processing apparatus 8 has the structure shown in FIG. 2, except the components for the raw material gas line 36 and upstream of it.

Figure 5:
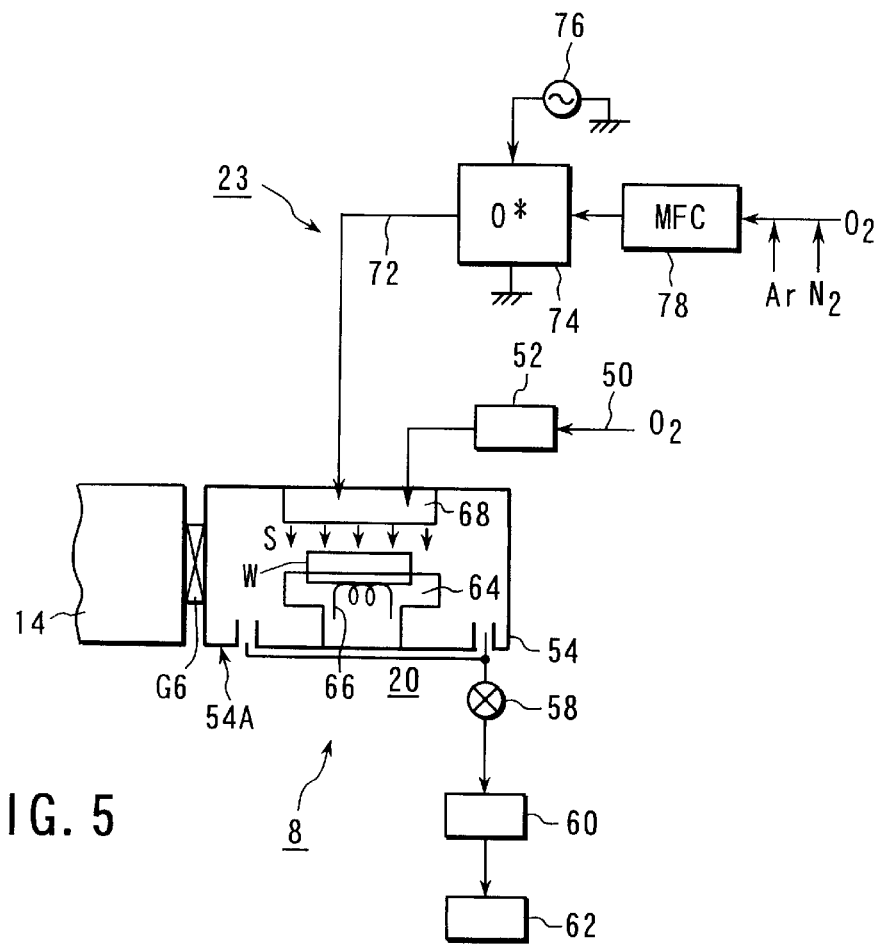
FIG. 5 is a constitutional view showing a modification of the heat-processing apparatus shown in FIG. 4.

FIG. 5 is a constitutional view showing a modification of the heat-processing apparatus 8 shown in FIG. 4. In this modification, a reforming gas line 72 is connected not to a reforming gas nozzle 70, but to a showerhead 68, so that a reforming gas is supplied through the showerhead 68.

An explanation will be given of methods according to the present invention, which are performed in the film-forming system 4 described above. In the methods according to the present invention, several methods can be adopted from deposition of a metal oxide film to crystallization of the film.

In a first method, a metal oxide film is deposited, and is then reformed, and if necessary, the film is then crystallized. In this case, there is a first route R1 in which a semiconductor wafer is transferred from the CVD apparatus 6 to the heat-processing apparatus 8 for reformation and crystallization (see FIG. 1), and a second route R2 in which a semiconductor wafer is transferred from the heat-processing apparatus 10 for deposition and reformation to the heat-processing apparatus 12 only for crystallization.

Where the heat-processing apparatus 10 for deposition and reformation is used, the deposition and the reformation are performed repeatedly a predetermined number of times.

In a second method, a metal oxide film is deposited and reformed at the same time, and if necessary, the film is then crystallized. In this case, there is a third route R3 in which a semiconductor wafer is transferred from the heat-processing apparatus 10 for deposition and reformation to the heat-processing apparatus 12 only for crystallization. The second and third routes R2 and R3 use a route the same as each other.

With reference to the system shown in FIG. 1, new semiconductor wafers W are accommodated in the cassette chamber 16A, and processed semiconductor wafers W are accommodated in the cassette chamber 16B. The wafers W are transferred by the transfer arm mechanism 18 in the common transfer apparatus 14, which is suitably expanded, contracted, and rotated.

First Route R1 of First Method

Figure 6A:
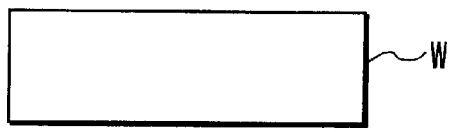
FIGS. 6A, 6B, 6C, and 6D are views showing a film-forming method where the steps of deposition, reformation, and crystallization are performed separately from each other, while the reformation and the crystallization are conducted in the same heat-processing apparatus.
Figure 6B:
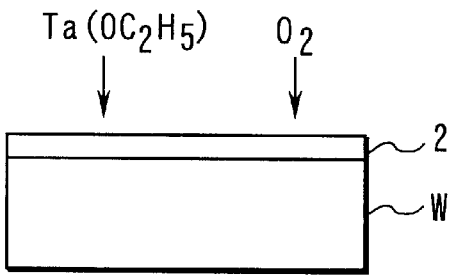
Figure 7A:
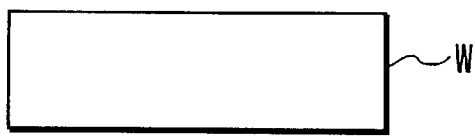
FIGS. 7A, 7B, and 7C are views showing a film-forming method where the steps of reformation and crystallization are performed at the same time.
Figure 7B:
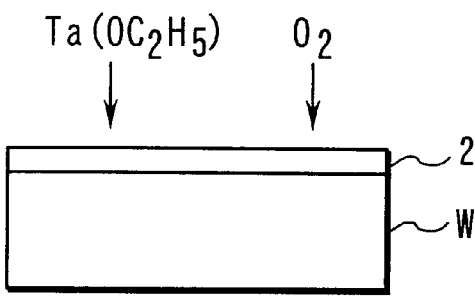
Figure 7C:
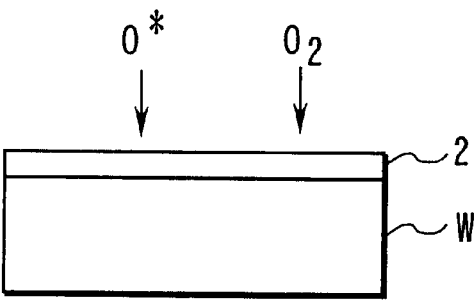

The first route R1 of the first method, in which a deposition process and a reformation process for a metal oxide film are performed separately from each other, will be explained, with reference to FIGS. 6A to 6D, and FIGS. 7A to 7C. FIGS. 6A to 6D are views showing a film-forming method where the steps of deposition, reformation, and crystallization are performed separately from each other, while the reformation and the crystallization are conducted in the same heat-processing apparatus. FIGS. 7A to 7C are views showing a film-forming method where the steps of reformation and crystallization are performed at the same time.

Where the steps are performed separately from each other, a new semiconductor, as shown in FIG. 6A, is transferred into the CVD apparatus 6. In the CVD apparatus 6, a tantalum oxide ($Ta_2O_5$) film 2, i.e., a metal oxide film, is deposited on the wafer W, by means of a conventional method, while $Ta(OC_2H_5)_5$ and $O_2$ are supplied, as shown in FIG. 6B. The CVD apparatus 6 has the structure of the heat-processing apparatus 10 for deposition and reformation shown in FIG. 2, except the reforming gas supply section 23. The deposition step at this time will be explained later, when an explanation is given of a case where only a deposition process is performed in the heat-processing apparatus 10 for deposition and reformation.

The wafer W with the tantalum oxide film 2 having a predetermined thickness and deposited thereon is then transferred into the heat-processing apparatus 8 for reformation and crystallization. In the heat-processing apparatus 8, a reformation process shown in FIG. 6C, and a crystallization process shown in FIG. 6D are sequentially performed.

In the reformation process, as shown in FIG. 4, the wafer W mounted on the worktable 64 in the process chamber 54 is heated to a temperature set to fall in a range of, e.g., from a room temperature to 700° C., and preferably not more than 500° C., which is lower than the crystallization temperature of tantalum oxide. A reforming gas is supplied from the reforming gas nozzle 70 of the reforming gas supply section 23 at a controlled flow rate, while the process chamber 54 is vacuum-exhausted, so that the interior of the process chamber 54 is kept at a predetermined pressure of, e.g., from 133 to 79,800 Pa (from 1 to 600 Torr). Under these conditions, the reformation process is performed for a predetermined period of time. During this process, $O_2$ may be supplied from the showerhead 68.

In the reforming gas generator 74, ions and electrons having high energy are generated in addition to oxygen radicals. However, the ions and electrons are trapped on the wall of the reforming gas generator 74 and/or the reforming gas line 72, through which the reforming gas is transferred. As a result, the reforming gas, which contains a sufficient amount of oxygen radicals, and has a concentration of ions and electrons not more than $10^5/cm^3$, is finally supplied from the nozzle 70 into the process chamber 54. It follows that the wafer W is not damaged by the ions and electrons having high energy, but a tantalum oxide film having a high quality can be formed.

After the reformation process, a condition is set such that $O_2$ gas and the reforming gas are supplied, or only $O_2$ gas is supplied while the reforming gas stops being supplied. In addition, the wafer W is heated to a temperature not lower than 700° C., and preferably of about 850° C., which is higher than the crystallization temperature of tantalum oxide. Under the conditions, the crystallization process is performed for a predetermined period of time. After the crystallization process, the wafer W is transferred into the cassette chamber 16B.

Experiment 1

A tantalum oxide film was reformed by the above-described method according to the present invention and a conventional UV ozone method, and the quality of the film was evaluated. In this experiment, two wafers were processed in each of the present invention method and the conventional method.

Table 1 shows the result of the evaluation, in which "EFT", "LC", "UV-O3", and "Example" denote effective film thickness, leakage current, the conventional method, and the present invention method, respectively.

TABLE 1

|  | EFT(nm) | LC(A/cm²: +1.2 V) | LC(A/cm²: −1.2 V) |
| --- | --- | --- | --- |
| UV-O3 (1) | 3.96 | $1.2 \times 10^{-7}$ | $1.4 \times 10^{-7}$ |
| UV-O3 (2) | 3.93 | $2.1 \times 10^{-7}$ | $2.1 \times 10^{-7}$ |
| Example (1) | 3.62 | $2.6 \times 10^{-8}$ | $2.2 \times 10^{-8}$ |
| Example (2) | 3.58 | $3.6 \times 10^{-8}$ | $2.9 \times 10^{-8}$ |

As shown in Table 1, the films formed by the present invention method showed a lower leakage current in spite of a smaller thickness, as compared to the films formed by the conventional method. Accordingly, it has been confirmed that the reformation process according to the present invention method provides a film quality better than that provided by the reformation process according to the conventional method.

Figure 6C:
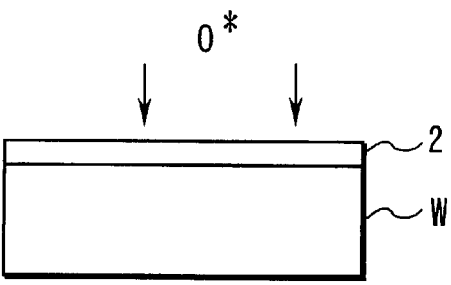
Figure 6D:
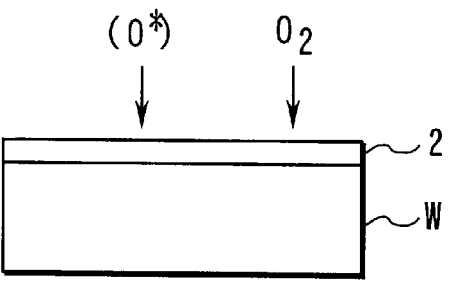

In the method described above, the reformation process and the crystallization process are sequentially performed in the single process chamber, as shown in FIGS. 6C and 6D.

However, these processes may be performed at the same time, as shown in FIGS. 7A to 7C, in which FIGS. 7A and 7B are the same as FIGS. 6A and 6B. In this case, the reformation process and the crystallization process are performed at the same time, while $O_2$ gas and the reforming gas described above are supplied, in the heat-processing apparatus 8 for reformation and crystallization. The process pressure at this time set to fall in a range of from 133 to 79,800 Pa, and the wafer is kept at a temperature not lower than 700° C., and preferably of about 730° C.

In this case, in order not to make the reformation process insufficient, the tantalum oxide film 2 should be as thin as, e.g., 8 nm or less. In the method shown in FIGS. 7A to 7C, since the reformation process and the crystallization process are performed at the same time, the total process time can be shortened by one step, thereby improving the throughput.

Second Route R2 of First Method

The second route R2 of the first method, in which a deposition process and a reformation process for a metal oxide film are performed separately from each other, will be explained, with reference to FIGS. 8A to 8D, and FIGS. 9A to 9F. FIGS. 8A to 8D are views showing a film-forming method where the steps of deposition, reformation, and crystallization are performed separately from each other, while the deposition and the reformation are conducted in the same heat-processing apparatus. FIGS. 9A to 9F are views showing a film-forming method where the steps of deposition and reformation are repeatedly performed.

Figure 8A:
FIGS. 8A, 8B, 8C, and 8D are views showing a film-forming method where the steps of deposition, reformation, and crystallization are performed separately from each other, while the deposition and the reformation are conducted in the same heat-processing apparatus.

A new semiconductor, as shown in FIG. 8A, is transferred from the cassette chamber 16A into the heat-processing apparatus 10 for deposition and reformation. In the heat-processing apparatus 10, a deposition process shown in FIG. 8B, and a reformation process shown in FIG. 8C are sequentially performed. When the deposition process is performed, the reforming gas supply section 23 is stopped so as not to supply a reforming gas, while only the raw material gas supply section 22 is operated in the apparatus shown in FIG. 2.

More specifically, a pressurizing gas, such as He gas, is supplied at a controlled flow rate into the raw material tank 26 shown in FIG. 2. The raw material liquid 24 of $Ta(OC_2H_5)_5$ is supplied through the raw material liquid line 34 at a flow rate controlled by the mass flow controller 40 by the pressure of the pressurizing gas. At this time, the flow rate of the raw material is set to be, e.g., about several tens mg/min. The raw material 24 in the tank 26 is warmed by the heater 28, so that it has a low viscosity and is supplied through the liquid line 34 smoothly. The raw material thus supplied at pressure is vaporized in the vaporizer 32 by a vaporizing gas, such as He gas, which is supplied at a controlled flow rate of, e.g., from 200 to 500 sccm. The raw material gas thus obtained flows downstream through the raw material gas line 36 and is supplied into the showerhead 68 of the process chamber 54. At the same time, $O_2$ gas is supplied as an oxidizing gas at a flow rate of, e.g., 1,500 sccm. The process temperature is set to fall in a range of, e.g., from 350 to 500° C. The process pressure is set to fall in a range of, e.g., from 13.3 to several hundreds Pa (from 0.1 to several Torr), such as about 400 Pa (3.0 Torr).

Under the conditions, the deposition process is performed for a predetermined period of time, so that a tantalum oxide film 2 having a thickness of, e.g., about 8 nm is deposited. After the deposition process, the raw material gas of $Ta(OC_2H_5)_5$ is stopped, as shown in FIG. 8C. The reforming gas supply section 23 is started, so that a reforming gas consisting of an excited oxygen gas containing substantially no ions or electrons is supplied into the process chamber 54 through the reforming gas nozzle 70, and the reformation process is performed for a predetermined period of time, as described with reference to FIG. 6C. During this process, $O_2$ may be supplied from the showerhead 68. The process temperature of the reformation is set to fall in a range of from a room temperature to 700° C., as described previously.

After the reformation process, the wafer W is transferred to the heat-processing apparatus 12 dedicated only to crystallization (see FIG. 1). In the heat-processing apparatus 12, the tantalum oxide film 2 is crystallized, as shown in FIG. 8D. The process conditions of this process are the same as those of the process described with reference to FIG. 6D, namely, using a process temperature not lower than 700° C. After the crystallization process, the wafer W is transferred from the heat-processing apparatus 12 into the cassette chamber 16B.

In this method, since the deposition process and the reformation process are performed in the heat-processing apparatus 10 for deposition and reformation, the time needed for transferring the wafer is omitted, thereby improving the throughput, as compared to a case where the two processes are performed in apparatuses independent of each other. In addition, only one apparatus suffices, thereby reducing the system cost.

Figure 8B:
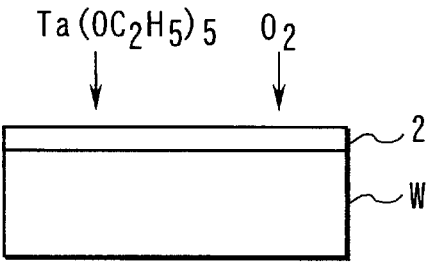
Figure 8C:
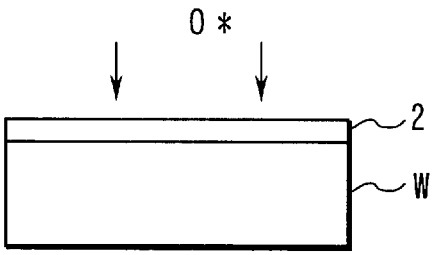
Figure 8D:
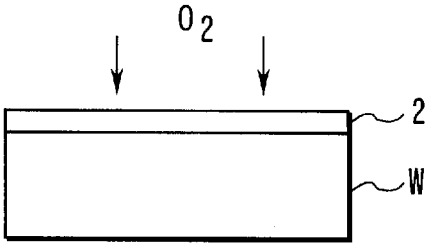
Figure 9A:
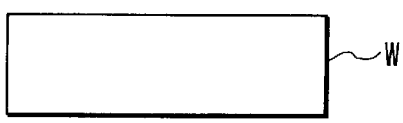
FIGS. 9A, 9B, 9C, 9D, 9E, and 9F are views showing a film-forming method where the steps of deposition and reformation are repeatedly performed.
Figure 9B:
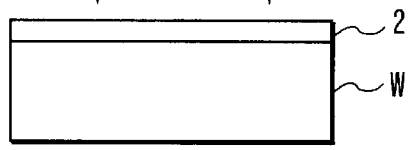
Figure 9C:
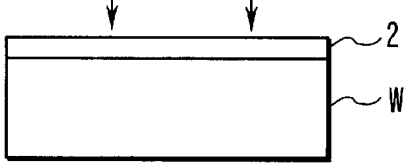
Figure 9D:
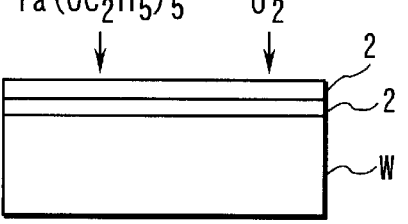
Figure 9E:
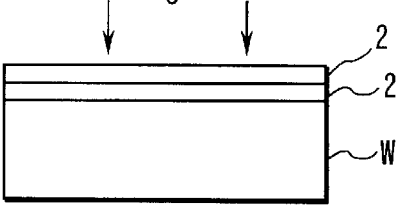
Figure 9F:
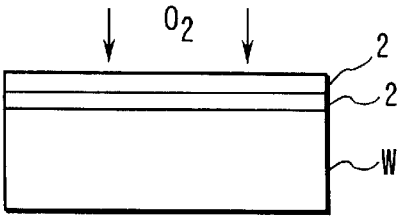

In this method, the deposition process shown in FIG. 8B and the reformation process shown in FIG. 8C are respectively performed only once. However, the two processes may be repeatedly performed two times or more, e.g., in the order of deposition, reformation, deposition, and reformation, as shown in FIGS. 9A to 9F, so that thin tantalum oxide films 2 are stacked while they are reformed. The tantalum oxide films formed by this method, which finally becomes one thick film, can be reformed in a period of time shorter than a case where a thick tantalum oxide film is deposited by one deposition process and is reformed. As a result, it is possible to improve the throughput.

Experiment 2

The first and second routes R1 and R2 of the first method, and a conventional method were performed for evaluation. In the case of the conventional method, the reformation process was performed in an ozone atmosphere with UV ray irradiation. In the case of the first route R1, the reformation process was performed, without UV ray irradiation, in an atmosphere of a reforming gas consisting of an excited oxygen gas containing substantially no ions or electrons, and the deposition process and the reformation were conducted in processing apparatuses independent of each other. In the case of the second route R2, the reformation process was performed in the reforming gas atmosphere described above, and the deposition process and the reformation were conducted in the same heat-processing apparatus. The formed devices were evaluated on the basis of breakdown time, where a voltage of 3.8V was applied to them at a temperature of 120° C.

The devices formed by the conventional method, and the first and second routes R1 and R2 of the present invention showed breakdown times of 64 seconds, 184 seconds, and 9,766 seconds, respectively. It has been found that the methods according to the present invention can remarkably prolong the breakdown time, and especially the second routes R2 is excellent, such that it can prolong the lifetime of devices more than 100 times.

The reason as to why the second routes R2 can remarkably prolong the lifetime of devices is believed to be as follows. First, since a wafer is reformed in two steps, carbon C in the film is substantially removed, so that the film is sufficiently reformed. Furthermore, the wafer is reformed in a so-called in-chamber manner, and is not transferred to another chamber, thereby reducing the possibility of contamination. The reason as to why the first routes R1 can also prolong the life time of devices as compared to the conventional method is thought such that the reforming gas described above allows carbon in the film to be well removed, so that the film is sufficiently reformed.

Third Route R3 of Second Method

Figure 10A:
FIGS. 10A, 10B, and 10C are views showing a film-forming method where the steps of deposition and reformation are performed at the same time.
Figure 10B:
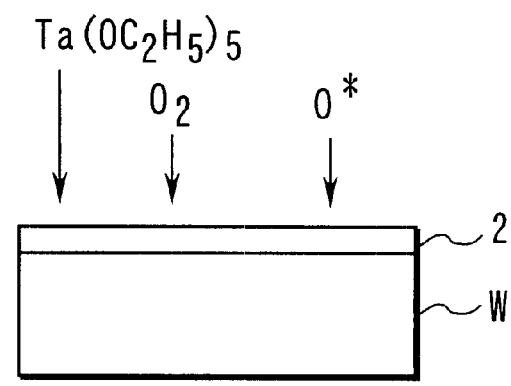
Figure 10C:
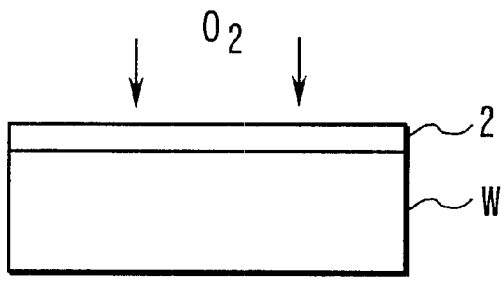

The third route R3 of the second method, in which a deposition process and a reformation process for a metal oxide film are performed at the same time, will be explained, with reference to FIGS. 10A to 10C. FIGS. 10A to 10C are views showing a film-forming method where the steps of deposition and reformation are performed at the same time. In the third route R3, a semiconductor wafer is processed while it is transferred in the same order as in the second routes R2.

A new semiconductor, as shown in FIG. 10A, is transferred from the cassette chamber 16A into the heat-processing apparatus 10 for deposition and reformation. In the heat-processing apparatus 10, deposition and reformation processes shown in FIG. 10B are performed at the same time. In other words, the film is deposited while it is reformed. It is possible to turn on and off the raw material gas repeatedly, so that the formed film can be better reformed.

In this method, both the raw material gas supply section 22 and the reforming gas supply section 23 are operated, so that a raw material gas of $Ta(OC_2H_5)_5$, $O_2$ gas, and a reforming gas consisting of an excited oxygen gas containing substantially no ions or electrons are supplied into the process chamber 54 at the same time. The process conditions, such as the supply rate of the raw material gas, the temperature, and the pressure, may be set at values the same as those of the deposition process shown in FIG. 8B, and the supply rate of the reforming gas may be set at a value the same as that of the reformation process shown in FIG. 8C.

For example, the flow rates of the raw material gas, the oxidizing gas, and the reforming gas are set to fall in ranges of from 10 to 200 mg/min, from 0 to 2,000 sccm, and from 100 to 4,000 sccm, respectively. The process temperature is set to fall in a range of from 350 to 500° C., and preferably of from 440 to 480° C. After the deposition and reformation processes, the wafer is subjected to a crystallization process, as shown in FIG. 10C, in the heat-processing apparatus 12 dedicated only to crystallization.

As described above, since the deposition process and the reformation process are performed at the same time, one process step is omitted, thereby improving the throughput. In addition, only one apparatus suffices, thereby reducing the system cost.

Figure 11:
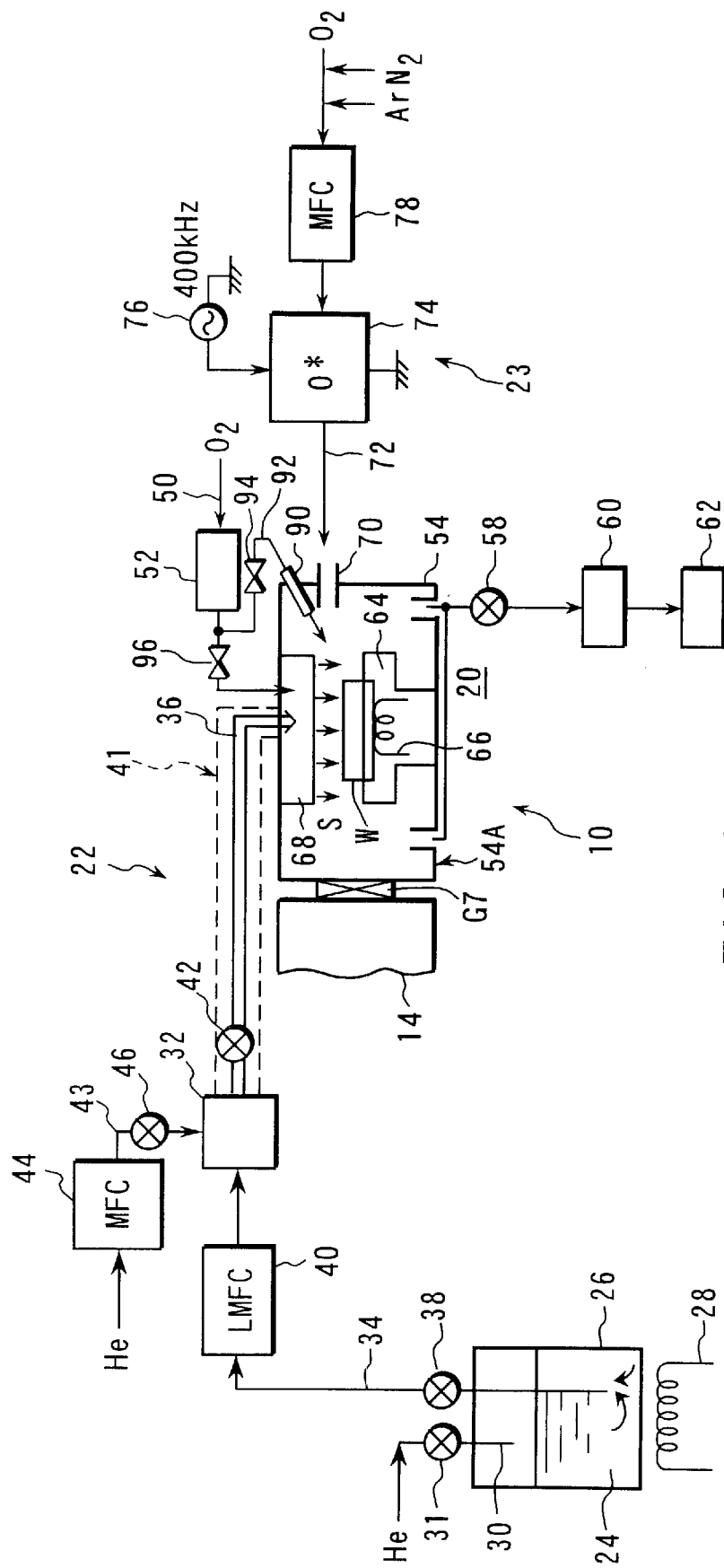
FIG. 11 is a constitutional view showing another modification of the heat-processing apparatus shown in FIG. 2.
Figure 12:
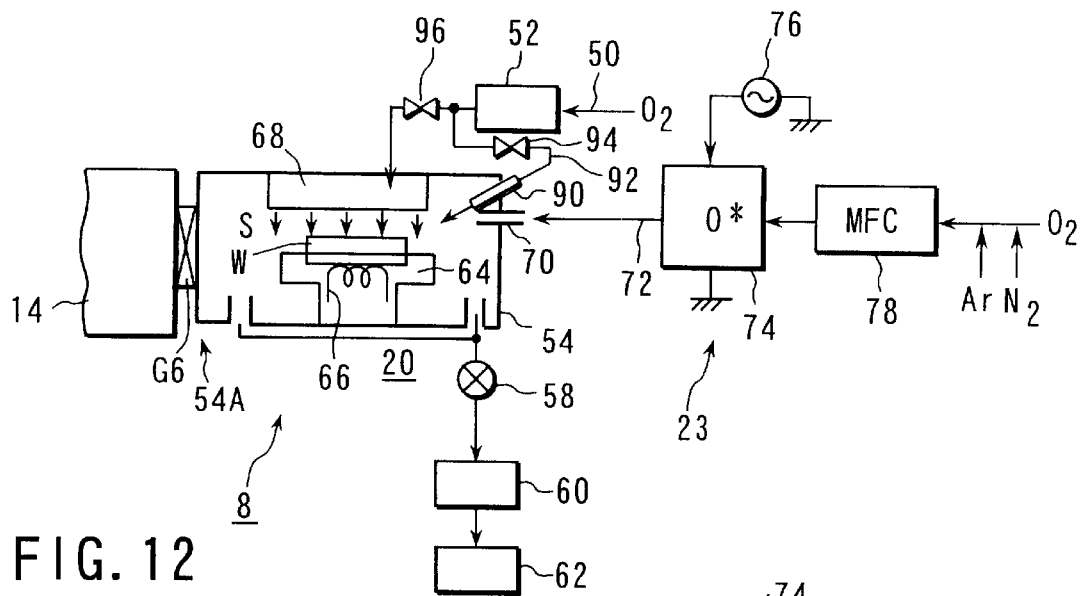
FIG. 12 is a constitutional view showing a modification of the heat-processing apparatus shown in FIG. 3.

FIG. 11 is a constitutional view showing another modification of the heat-processing apparatus shown in FIG. 2. FIG. 12 is a constitutional view showing a modification of the heat-processing apparatus shown in FIG. 3. In these modifications, a reforming gas supplied from a reforming gas supply section 23 through a nozzle 70 into a process chamber 54 is mixed with non-excited $O_2$ gas sprayed thereto. With this arrangement, even if the reforming gas supplied from the nozzle 70 contains ions and electrons, which affect the reformation process, other than oxygen radicals, it is possible to make the ions and electrons disappear.

More specifically, in each of the modifications, an oxygen gas nozzle 90 is disposed adjacent to the reforming gas nozzle 70 in the process chamber 54. The spouting direction of the nozzle 90 is oriented to cross the spouting direction of the nozzle 70. The reforming gas spouted into the process chamber 54 immediately comes into contact with the non-excited oxygen gas, and is mixed therewith. A branch line 92 is connected to an oxidizing gas line 50 at the outlet of the flow controller 52. The branch line 92 and the oxidizing gas line 50 are provided with switching valves 94 and 96, respectively, downstream of the branching point. At least during the reformation process, $O_2$ gas is spouted from the oxygen gas nozzle 90 to remove ions and electrons from the reforming gas.

A modification may be adopted such that excited oxygen gas and non-excited oxygen gas are mixed in a showerhead 68, to obtain a desirable reforming gas.

In the embodiments described above, a tantalum oxide film is formed as a metal oxide film, but the present invention is applicable to another metal oxide film. An example of anther metal oxide film is a film made of a material, such as barium strontium titanate (BST: $Ba_{1-x}Sr_xTiO_3$), strontium titanate ($SrTiO_3$), strontium bismuth tantalate (SBT), lead zirconium titanate (PZT: $Pb_{1-x}Zr_xTiO_3$), or another dielectric substance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A single substrate processing film forming method, comprising:
    a deposition step of depositing a film comprising an amorphous metal oxide on a target substrate by chemical vapor deposition CVD;
    a reformation step of supplying a reforming gas onto the film to remove an organic impurity contained in the film; and
    a crystallization step of heating the film to a temperature higher than a crystallization temperature of the metal oxide to crystallize the film,
    wherein the reformation step comprises a step of preparing the reforming gas by mixing an excited oxygen gas with a non-excited oxygen gas, and
    the reformation step comprises a step of heating the film to a temperature higher than the crystallization temperature of the metal oxide in order to perform the crystallization step at the same time as the reformation step.

2. The method according to claim 1, the excited oxygen gas is mixed with the non-excited oxygen gas to prepare the reforming gas before the reforming gas is supplied to a process chamber in which the reformation step is performed.

3. The method according to claim 1, wherein the excited oxygen gas is mixed with the non-excited oxygen gas to prepare the reforming gas within a process chamber in which the reformation step is performed.

4. The method according to claim 1, wherein the reforming gas comprises a concentration of ions and electrons not more than $10^5/cm^3$.

5. The method according to claim 1, wherein the reformation step comprises a step of exciting oxygen gas until generating a plasma to form the excited oxygen gas by an exciting mechanism disposed outside a process chamber in which the reformation step is performed.

6. The method according to claim 1, wherein the reforming gas comprises a catalytic gas which accelerates activation of the oxygen gas at a concentration of from 0 to 15 flow-rate %.

7. The method according to claim 6, wherein the catalytic gas comprises $N_2$.

8. The method according to claim 1, wherein the deposition step and the reformation step are performed in a single process chamber, and the deposition step comprises a step of supplying a raw material gas, which offers a metal of the metal oxide by decomposition, and an oxidizing gas into the process chamber accommodating the target substrate, while exhausting the process chamber.

9. The method according to claim 8, wherein the raw material gas comprises a metal alkoxide.

10. The method according to claim 9, wherein the raw material gas comprises pentoethoxytantalum, and the oxidizing gas comprises at least one of $O_2$, $O_3$, $N_2O$, $NO$, $NO_2$, and a vaporized alcohol.

11. The method according to claim 8, wherein the deposition step and the reformation step are repeated a plurality of times before the crystallization step.

12. The method according to claim 11, further comprising the steps of:

exciting the oxygen gas until generating a plasma by an exciting mechanism disposed outside the process chamber, and preparing the reforming gas by mixing the excited oxygen gas with a non-excited oxygen gas to reduce a concentration of ions and electrons in the excited oxygen gas.

13. The method according to claim 11, wherein the reforming gas comprises a catalytic gas which accelerates activation of the oxygen gas at a concentration of from 0 to 15 flow-rate %.

14. The method according to claim 13, wherein the catalytic gas comprises $N_2$.

15. The method according to claim 11, wherein the deposition and reformation steps comprise a step of heating the film to a temperature lower than a crystallization temperature of the metal oxide.

16. The method according to claim 11, wherein the raw material gas comprises a metal alkoxide.

17. The method according to claim 11, wherein the raw material gas comprises pentoethoxytantaium, and the oxidizing gas comprises at least one of $O_2$, $O_3$, $N_2O$, $NO$, $NO_2$, and a vaporized alcohol.

18. A single substrate processing film forming method comprising:

a deposition step of supplying a raw material gas, which offers a metal by decomposition, and an oxidizing gas onto a target substrate to deposit a film comprising an amorphous metal oxide on the target substrate by chemical vapor deposition CVD;

a reformation step of supplying a reforming gas comprising an excited oxygen gas onto the film to remove an organic impurity contained in the film; and a crystallization step of heating the film to a temperature higher than a crystallization temperature of the metal oxide to crystallize the film, wherein the deposition step and the reformation step are performed at substantially the same time by supplying the raw material gas, the oxidizing gas, and the reforming gas into a single process chamber at substantially the same time.

19. The method according to claim 18, wherein the reforming gas comprises a concentration of ions and electrons not more than $10^5/cm^3$.

20. A single substrate processing film forming method comprising:

a deposition step of supplying a raw material gas, which offers a metal by decomposition, and an oxidizing gas onto a target substrate to deposit a film comprising an amorphous metal oxide on the target substrate by chemical vapor deposition CVD;

a reformation step of supplying a reforming gas containing an excited oxygen gas onto the film to remove an organic impurity contained in the film; and a crystallization step of heating the film to a temperature higher than a crystallization temperature of the metal oxide to crystallize the film, wherein the deposition step and the reformation steps are repeated a plurality of times before the crystallization step.

21. The method according to claim 20, wherein the deposition step and the reformation step are performed at substantially the same time by supplying the raw material gas, the oxidizing gas, and the reforming gas into a single process chamber at substantially the same time.

22. The method according to 20, wherein the reformation step comprises a step of preparing the reforming gas by mixing the excited oxygen gas with a non-excited oxygen gas.

* * * * *

UNITED STATES PATENT AND TRADEMARK OFFICE
CERTIFICATE OF CORRECTION

PATENT NO. : 6,649,218 B2
DATED : November 18, 2003
INVENTOR(S) : Shao

It is certified that error appears in the above-identified patent and that said Letters Patent is hereby corrected as shown below:

<u>Title page,</u>
Item [12], Inventor's name should read:
-- [12]  United States Patent
         Shao --
Item [75], Inventor, should read:
-- [75]  Inventor:       Shou-Qian Shao, Tsukui-gun (JP) --

Signed and Sealed this

Second Day of March, 2004

JON W. DUDAS
*Acting Director of the United States Patent and Trademark Office*